United States Patent [19]

Lloyd

[11] Patent Number: 4,537,246
[45] Date of Patent: Aug. 27, 1985

[54] VERTICAL HEAT SINK

[75] Inventor: Robert H. F. Lloyd, Woodside, Calif.

[73] Assignee: Conver Corporation, Woodside, Calif.

[21] Appl. No.: 559,782

[22] Filed: Dec. 9, 1983

[51] Int. Cl.³ .............................................. H01L 23/40
[52] U.S. Cl. ................................ 165/80 B; 165/80 R; 357/81
[58] Field of Search ................. 165/80 R, 80 A, 80 B; 357/81, 72

[56] References Cited

U.S. PATENT DOCUMENTS 3,548,927  12/1970  Spurling ............................ 165/80 B
4,054,901  10/1977  Edwards et al. ................... 357/72 X
4,235,285  11/1980  Johnson et al. .................... 165/80 B

OTHER PUBLICATIONS

IBM Technical Disclosure Bulletin, vol. 24, No. 7B, "Clip on Heat Sink", A. B. Habich, Dec. 1981.

Primary Examiner—Stephen F. Husar
Attorney, Agent, or Firm—Weiss & Holloway

[57] ABSTRACT

A heat sink for generating heat dissipated by an electronic component mounted thereon includes a vertical heat conductive member, and a resilient clip having first and second legs which are resiliently biased towards each other such that when the clip is slipped over the upper edge of the vertical member, the first leg is urged toward the surface of said vertical member so as to hold an electronic component therebetween. The second leg is equipped with a perpendicular terminating lip which engages the lower edge of the vertical member so as to prevent inadvertent upward movement of the clip. The vertical member is provided with mounting tabs which may be coupled to the holes or vias in a printed circuit board. Additional mounting pads are provided at the upper portion of the vertical member in a plane perpendicular to the vertical member to which a horizontal plate may be coupled.

10 Claims, 8 Drawing Figures

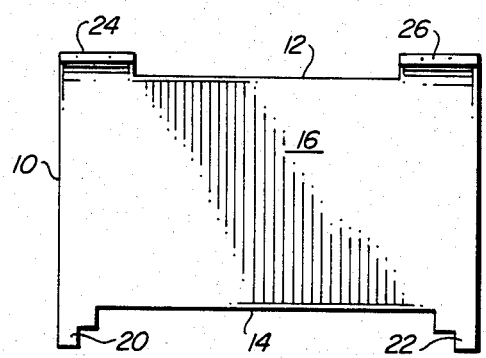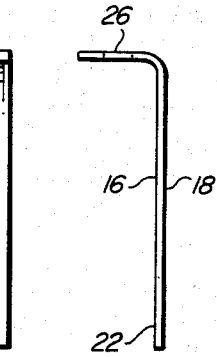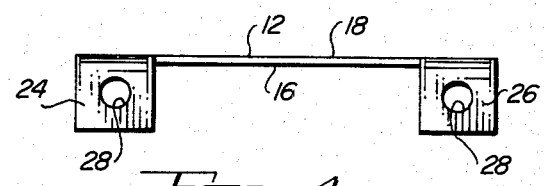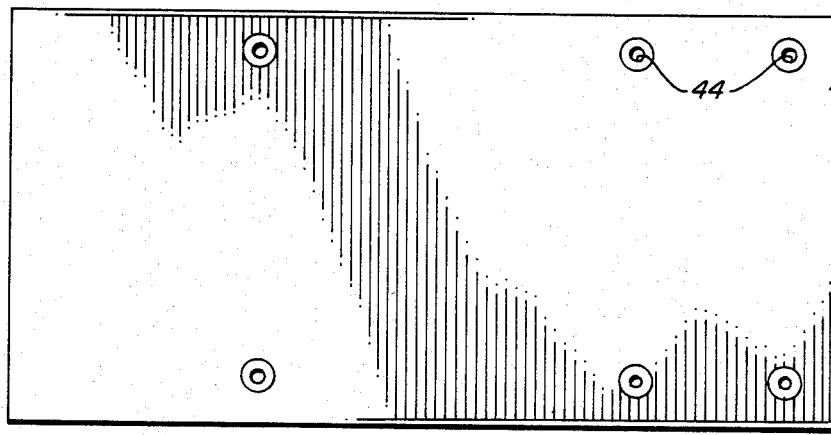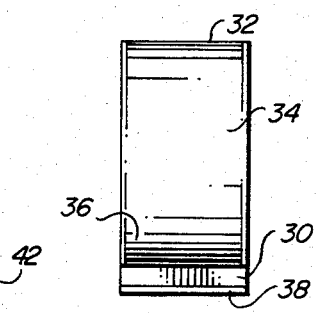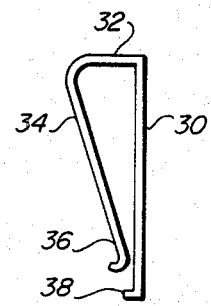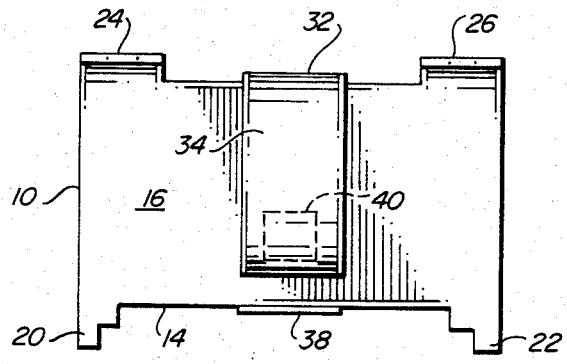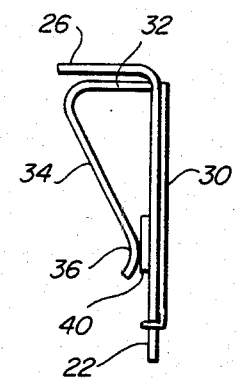

VERTICAL HEAT SINK

BACKGROUND OF THE INVENTION

This invention relates generally to heat sinks, and more particularly, to a vertical heat sink for dissipating heat generated by the components of a power supply.

It is well known that the components of a power supply generate a great deal of heat which, if not adequately dissipated, could result in damage to the components and perhaps failure of the power supply itself.

The prior art is replete with various types and forms of heat sinks to which or on which an electronic component may be coupled. However, as advances in technology permit the development of new and more complex power supplies, the need arises for new and improved heat sinks.

SUMMARY OF THE INVENTION

It is an object of the present invention to provide an improved heat sink for use in power supplies.

It is a further object of the present invention to provide an improved vertical heat sink which may be coupled to a printed circuit board and upon which an electronic component may be mounted.

It is a still further object of the present invention to provide a vertical heat sink including a resilient clip for positioning an electronic component thereon.

It is still a further object of the present invention to provide a vertical heat sink including means for coupling a horizontal plate thereto.

According to a broad aspect of the invention, there is provided a heat sink for dissipating heat generated by an electronic component comprising a vertical heat conductive member having upper and lower edges and first and second surfaces, and a resilient clip having first and second legs resiliently biased towards each other such that when the clip is slipped over the upper edge of the vertical member, the upper edge passes between the first and second legs and the first leg is urged towards the first surface to hold the electronic component therebetween. The second leg of the clip is equipped with a terminating leg which lies in a plane perpendicular to the plane of the second leg of the clip and passes under the lower edge of the vertical member when the clip is properly positioned. The lower edge of the vertical member is provided with first and second mounting tabs at opposite ends thereof to permit mounting of the vertical member on, for example, a printed circuit board. The vertical member is also provided with third and fourth mounting tabs proximate opposite ends of its upper edge and having apertures therethrough to permit coupling of a horizontal plate to the vertical member.

The above and other objects, features and advantages of the present invention will be more clearly understood by the following detailed description taken in conjunction with the accompanying drawings, in which:

BRIEF DESCRIPTION OF THE DRAWINGS

FIGS. 1a, 1b and 1c are front, side and top views of the inventive vertical heat sink;

FIG. 2 is a top view of a top plate which may be coupled to one or more of the vertical heat sinks shown in FIGS. 1a, 1b, and 1c;

FIGS. 3a and 3b are front and side views respectively of a spring clip which is used in conjunction with the vertical heat sink shown in FIGS. 1a, 1b and 1c for the purpose of mounting a component thereon; and FIGS. 4a and 4b are front and side views of the vertical heat sink as shown in FIGS. 1a and 1b having the spring clip shown in FIGS. 3a and 3b mounted thereon.

DESCRIPTION OF THE PREFERRED EMBODIMENT

Referring to FIGS. 1a, 1b and 1c which are front, side and top views of a vertical heat sink in accordance with the present invention, the vertical heat sink, preferably copper, comprises a vertical plate 10 having an upper edge 12, a lower edge 14, and first and second surfaces 16 and 18 respectively. First and second connecting tabs 20 and 22 respectively are provided at opposite ends of lower edge 14 and are coplanar with vertical plate 10. For example, connecting tabs 20 and 22 are of a size so as to be accommodated by the holes or apertures contained in a standard printed circuit board. The vertical heat sink includes projections 24 and 26 proximate opposite ends of upper edge 12 which are bent so to be substantially horizontal. As can be seen, horizontal projections 24 and 26 each have an aperture 28 therethrough for reasons which will be discussed hereinbelow.

FIGS. 3a and 3b are front and side views respectively of a spring clip for use in conjunction with the vertical sink shown in FIGS. 1a, 1b and 1c. As can be seen, the spring clip has a triangular shape including a first straight leg 30, a second straight leg 32 extending perpendicularly from leg 30, and an incline leg 34 which terminates in a curved portion 36. As can be seen, curved portion 36 resiliently engages straight leg 30. It should be noted that straight leg 30 is provided with a lip 38 extending perpendicularly from the lower edge of straight leg 30. The reason for this shall become apparent.

FIGS. 4a and 4b illustrate how a component 40 may be coupled to the vertical heat sink by means of the spring clip shown in FIGS. 3a and 3b. The spring clip is inserted over the upper edge 12 of the vertical heat sink and is urged downward in contact with the top surface of the component 40 until the lip 38 snaps below lower edge 14. The spring clip is attached after the component 40 has been mounted on the vertical heat sink.

If desired, a top plate 42 of the type shown in FIG. 2 may be placed on a plurality of vertical heat sinks after the clips and components have been positioned thereon. This may be accomplished, for example, by aligning apertures 4 on top plate 42 with apertures 28 on, for example, to such vertical heat sinks. The top plate may be fastened by screws or similar fasteners to the vertical heat sinks to complete the structure. However, the above description is given by way of example only. It should be understood that the clip for the vertical heat sink disclosed and claimed herein has a significant advantage over any type of horizontal holding device because of great ease and speed in rapid attachment and detachment from a vertical direction without interfering with components that are mounted in a horizontal direction adjacent to the vertical heat sink. This feature permits higher density printed circuit boards to be employed with resultant savings in space and in costs. Furthermore, the clip disclosed and claimed herein is extremely adaptable and can be used or positioned at any desired location on a vertical heat sink. Additionally, the clip disclosed and claimed herein permits the use of multiple such clips, if desired, in close proximity to each other on one or more vertical heat sinks thereby providing further density advantages. Changes in form and detail may be made by one skilled in the art without departing from the scope of the invention as defined by the appended claims.

I claim:

1. A heat sink for dissipating heat generated by an electronic component mounted thereon, comprising:

a vertical heat conductive member having upper and lower edges and first and second surfaces, said lower edge having connecting tabs at opposite ends thereof, said upper edges having two mounting tabs at opposite ends thereof, said mounting tabs having apertures passing therethrough; and resilient clip means removably coupled to said vertical heat conductive member for holding said electronic component to said vertical heat conductive member, said resilient clip means including first and second legs resiliently biased toward each other so that said first leg holds said electronic component against said vertical heat conductive member when said electronic component and said vertical heat conductive member are placed between said first and second legs, said second leg having a terminating lip which engages said lower edge of said vertical heat conductive member.

2. A heat sink according to claim 1 wherein said terminating lip of said clip means lies in a plane perpendicular to the plane of said second leg for passing under said lower edge.

3. A heat sink according to claim 2 further comprising a horizontal plate coupled to said mounting tabs.

4. A heat sink according to claim 3 wherein said horizontal plate has a plurality of apertures therethrough which may be aligned with the apertures in said mounting tabs of at least one of said vertical heat conductive members.

5. A heat sink according to claim 4 further including fastening means for coupling said horizontal plate to a plurality of said vertical heat conductive members.

6. A heat sink according to claim 5 wherein said vertical heat conductive members and said horizontal plate are made of copper.

7. A heat sink according to claim 2 wherein said mounting tabs lie in a plane perpendicular to the plane of said vertical heat conductive member.

8. A heat sink according to claim 7 wherein said connecting tabs are coplanar with said vertical heat conductive member.

9. A heat sink for dissipating heat generated by an electronic component mounted thereon, comprising:

a relatively flat vertical heat conductive member having upper and lower edges, said lower edge having connecting tabs coplanar with said vertical heat conductive member, said upper edge having mounting tabs lying in a plane perpendicular to said vertical heat conductive member, said mounting tabs having apertures passing therethrough; and resilient clip means removably coupled to said vertical heat conductive member for holding said electronic component to said vertical heat conductive member, said resilient clip means including first and second legs resiliently biased toward each other so that said first leg holds said electronic component against said vertical heat conductive member when said electronic component and said vertical heat conductive member are placed between said first and second legs, said second leg having a terminating lip which engages said lower edge of said vertical heat conductive member.

10. A heat sink according to claim 9 further comprising a horizontal plate coupled to said mounting tabs, said horizontal plate having a plurality of apertures therethrough which may be aligned with the apertures in said mounting tabs of at least one of said vertical heat conductive members.

* * * * *